United States Patent
Heinonen (10) Patent No.: US 9,574,936 B2
(45) Date of Patent: Feb. 21, 2017

(54) PLANAR IMAGING SENSOR HAVING PLURAL PHOTO DETECTOR GROUPS WITH DIFFERENT DETECTION WINDOWS

(71) Applicant: Sharper Shape Oy, Espoo (FI)

(72) Inventor: Tero Heinonen, Järvenpää (FI)

(73) Assignee: Sharper Shape Oy, Espoo (FI)

( * ) Notice: Subject to any disclaimer, the term of this patent is extended or adjusted under 35 U.S.C. 154(b) by 142 days.

(21) Appl. No.: 14/666,762

(22) Filed: Mar. 24, 2015

(65) Prior Publication Data
US 2016/0282177 A1   Sep. 29, 2016

(51) Int. Cl.
*H01L 27/146* (2006.01)
*G01J 1/44* (2006.01)
*G01S 17/00* (2006.01)

(52) U.S. Cl.
CPC ............... *G01J 1/44* (2013.01); *G01S 17/00* (2013.01); *H01L 27/146* (2013.01)

(58) Field of Classification Search
CPC ........ G01N 21/6408; G01P 1/08; G01P 3/481; G01J 1/44; H01L 27/146; G01S 17/00; B65H 2701/1311; B65H 2511/242
USPC ...... 250/208.1, 214 R, 214.1, 221; 356/4.07, 356/5.01–5.08; 348/296–311, 348, 370
See application file for complete search history.

(56) References Cited

U.S. PATENT DOCUMENTS 8,638,425 B2 *  1/2014  Hsu ..................... G01S 7/491
                                              250/208.1

* cited by examiner

*Primary Examiner* — Que T Le
(74) *Attorney, Agent, or Firm* — Ziegler IP Law Group, LLC (57) ABSTRACT

A planar imaging sensor is provided. The planar imaging sensor comprises a plurality of photo detectors, wherein the plurality of photo detectors are divided into at least a first group and a second group. The number of photo detectors in the second group is larger than the number of photo detectors in the first group. The photo detectors of the first group are configured to have a first detection window, while the photo detectors of the second group are configured to have a second detection window. The second detection window is configured to start later in time than the first detection window.

14 Claims, 5 Drawing Sheets

PLANAR IMAGING SENSOR HAVING PLURAL PHOTO DETECTOR GROUPS WITH DIFFERENT DETECTION WINDOWS

TECHNICAL FIELD

The present disclosure relates generally to light detection and ranging; and more specifically, to planar imaging sensors that are reconfigurable. Moreover, the present disclosure relates to sensor systems employing the aforesaid planar imaging sensors. Moreover, the present disclosure relates to methods for recording and processing of an image.

BACKGROUND

Light Detection And Ranging (LiDAR) is commonly used to detect shapes of objects. A LiDAR sensor emits light pulses, which are then reflected from surfaces in surroundings of the LiDAR sensor. When reflections of the emitted light pulses return to the LiDAR sensor, corresponding signals are recorded.

Typically, the intensity of the reflected light is inversely proportional to a square of a distance between the LiDAR sensor and a surface from which the light reflected back to the LiDAR sensor.

For illustration purposes, there will now be considered an example environment in which a LiDAR sensor is implemented. In the example environment, let us consider that blocks having a height of 20 meters are placed on a planar ground surface. Let us also consider that the LiDAR sensor views the blocks from a height of 50 meters above the ground surface. Let us also consider that the blocks and the ground surface have equal reflective (and refractive) properties towards the direction of light pulses emitted by the LiDAR sensor.

A light source associated with the LiDAR sensor emits light pulses, some of which are reflected back to the LiDAR sensor from the blocks and the ground surface. The intensity of light reflected from a top surface of a given block is approximately calculated to be A/(30×30), while the intensity of light reflected from the ground surface is approximately calculated to be A/(50×50). It is evident that the intensity of the light reflected from the ground surface is merely 36% of the intensity of the light reflected from the top surface of the given block.

As an additive noise component is the same for all the signals, a Signal-to-Noise Ratio (SNR) of the signals degrades significantly when the distance between the LiDAR sensor and the surface increases. Consequently, objects that are far away from the LiDAR sensor cannot be detected easily.

One conventional method of improving an SNR involves collecting multiple measurements, and averaging the multiple measurements. The multiple measurements can be collected from a same measurement point over time. However, this requires a lot of time. Alternatively, the multiple measurements can be collected over a spatial area using multiple sensors. However, this requires collecting a large number of measurements repeatedly.

SUMMARY

The present disclosure seeks to provide an improved imaging sensor.

The present disclosure also seeks to provide an improved sensor system.

A further aim of the present disclosure is to at least partially overcome at least some of the problems of the prior art, as discussed above.

In a first aspect, embodiments of the present disclosure provide a planar imaging sensor comprising a plurality of photo detectors, wherein
  the plurality of photo detectors are divided into at least a first group and a second group,
  the photo detectors of the first group are configured to have a first detection window,
  the photo detectors of the second group are configured to have a second detection window, which second detection window is configured to start later in time than the first detection window, and
  the number of photo detectors in the second group is larger than the number of photo detectors in the first group.

In a second aspect, embodiments of the present disclosure provide a sensor system comprising:
  a planar imaging sensor; and
  a processor communicably coupled to a light source and the planar imaging sensor, the processor being configured to process data collected by the planar imaging sensor from multiple spatial positions.

In a third aspect, embodiments of the present disclosure provide a method for recording and processing of an image, comprising:
  emitting light;
  detecting reflected light for a first period of time starting at time t1 and using a first group of photo detectors; and
  detecting reflected light for a second period of time starting at time t2 and using a second, larger group of photo detectors,
wherein t2 is later than t1.

Embodiments of the present disclosure substantially eliminate or at least partially address the aforementioned problems in the prior art, and enable detection of light reflected from different distances using a same sensor system.

Additional aspects, advantages, features and objects of the present disclosure would be made apparent from the drawings and the detailed description of the illustrative embodiments construed in conjunction with the appended claims that follow.

It will be appreciated that features of the present disclosure are susceptible to being combined in various combinations without departing from the scope of the present disclosure as defined by the appended claims.

BRIEF DESCRIPTION OF THE DRAWINGS

The summary above, as well as the following detailed description of illustrative embodiments, is better understood when read in conjunction with the appended drawings. For the purpose of illustrating the present disclosure, exemplary constructions of the disclosure are shown in the drawings. However, the present disclosure is not limited to specific methods and instrumentalities disclosed herein. Moreover, those in the art will understand that the drawings are not to scale. Wherever possible, like elements have been indicated by identical numbers.

Embodiments of the present disclosure will now be described, by way of example only, with reference to the following diagrams wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION OF EMBODIMENTS

The following detailed description illustrates embodiments of the present disclosure and ways in which they can be implemented. Although some modes of carrying out the present disclosure have been disclosed, those skilled in the art would recognize that other embodiments for carrying out or practicing the present disclosure are also possible.

GLOSSARY

Brief definitions of terms used throughout the present disclosure are given below.

The term "photo detector" generally refers to an input sensor for detecting light. An example of a photo detector is a binary sensor that is triggered by an arriving photon. A specific example of a photo detector is a Single Photon Avalanche Diode (SPAD) that is capable of detecting low intensity light, for example, down to a single photon.

The term "detection window" generally refers to a period of time when a photo detector is configured to detect reflected light. A detection window can also be defined as a gating time for which a photo detector is gated to detect reflected light. In a Light Detection And Ranging (LiDAR) application, when a given photo detector is configured to have a specific detection window, the given photo detector is configured to detect light reflected from distances defined by the specific detection window.

The term "airborne device" generally refers to a device that is airborne and is free to move. An airborne device could be implemented by way of a miniature helicopter, a miniature multi-copter, a miniature fixed-wing aircraft, a miniature harrier, or any other unmanned aerial vehicle.

The terms "connected" or "coupled" and related terms are used in an operational sense and are not necessarily limited to a direct connection or coupling. Thus, for example, two devices may be coupled directly, or via one or more intermediary media or devices. As another example, devices may be coupled in such a way that information can be passed there between, while not sharing any physical connection with one another. Based on the present disclosure provided herein, one of ordinary skill in the art will appreciate a variety of ways in which connection or coupling exists in accordance with the aforementioned definition.

The phrases "in an embodiment", "in accordance with an embodiment" and the like generally mean the particular feature, structure, or characteristic following the phrase is included in at least one embodiment of the present disclosure, and may be included in more than one embodiment of the present disclosure. Importantly, such phrases do not necessarily refer to the same embodiment.

If the specification states a component or feature "may", "can", "could", or "might" be included or have a characteristic, that particular component or feature is not required to be included or have the characteristic.

In a first aspect, embodiments of the present disclosure provide a planar imaging sensor comprising a plurality of photo detectors, wherein the plurality of photo detectors are divided into at least a first group and a second group, the photo detectors of the first group are configured to have a first detection window, the photo detectors of the second group are configured to have a second detection window, which second detection window is configured to start later in time than the first detection window, and the number of photo detectors in the second group is larger than the number of photo detectors in the first group.

According to an embodiment, the plurality of photo detectors are divided into a plurality of groups, each group having a specific detection window. As the photo detectors of different groups are configured to different detection windows, the photo detectors of these groups are capable of detecting light reflected from different distances, namely from surfaces that are spatially positioned at different distances from the planar imaging sensor.

According to an embodiment, the number of photo detectors in each group corresponds to a starting time of the specific detection window. As an example, the second detection window is configured to start later in time than the first detection window, as the number of photo detectors in the second group is larger than the number of photo detectors in the first group. In other words, a larger number of photo detectors are employed to detect light reflected from longer distances. This compensates for lesser reflected light intensity of light reflected from longer distances. This potentially improves Signal-to-Noise Ratio (SNR) of data collected by the planar imaging sensor.

Beneficially, a sensitivity or noise tolerance of the planar imaging sensor can be adjusted by reconfiguring which photo detectors belong to which groups.

According to an embodiment, the grouping of photo detectors is reconfigurable. In other words, a given photo detector is not permanently assigned to a particular group. Moreover, the grouping of photo detectors is not limited any particular number of groups.

According to an embodiment, the second detection window is longer than the first detection window.

According to an embodiment, the second detection window is configured to start substantially when the first detection window is configured to end.

According to an embodiment, a detection window associated with a photo detector is reconfigurable. Optionally, in this regard, the detection window associated with the photo detector is dynamically configured to a detection window that is selected from a set of detection windows, wherein the set of detection windows includes a large number (e.g., millions) of detection windows of different durations having different starting times. Beneficially, the detection window associated with the photo detector can be reconfigured based on a given use case of the planar imaging sensor.

According to an embodiment, the plurality of photo detectors are Single Photon Avalanche Diodes (SPAD's).

According to an embodiment, the planar imaging sensor is implemented in one chip.

According to an embodiment, the planar imaging sensor further comprises at least one light emitting component. In this embodiment, the at least one light emitting component is integrated on a same chip on which the planar imaging sensor is implemented. As a result, the planar imaging sensor does not require an external light source. An example of the at least one light emitting component is a laser diode that is operable to produce pulses of light.

According to an embodiment, the planar imaging sensor further comprises at least one photo sensor configured to measure an intensity of light. In this embodiment, the at least one photo sensor is integrated on the same chip on which the planar imaging sensor is implemented.

An example of the at least one photo sensor is a photo diode that is used for capturing conventional intensity images. One specific example of the at least one photo sensor is a Charge-Coupled Device (CCD) that is typically used in digital imaging.

It will be appreciated that the photo detectors are used for range imaging, while the at least one photo sensor is used for capturing conventional intensity images. As an example, data collected by the photo detectors is post-processed to generate a range image representing distance to objects in the image, while data collected by the at least one photo sensor is post-processed to generate a conventional intensity image.

According to an embodiment, the planar imaging sensor includes optical band-pass filters for filtering light of a specific range of wavelengths. The optical band-pass filters are used to selectively transmit a portion of electromagnetic spectrum, while blocking all other wavelengths.

As an example, in a LiDAR application, suitable optical band-pass filters are positioned over the photo detectors to selectively transmit the wavelength of the laser light, as LiDAR typically uses laser pulses. This beneficially reduces noise in data collected by the photo detectors.

As another example, at least one suitable optical filter is positioned over the at least one photo sensor to capture a desired intensity image. Examples of the colour image include, but are not limited to, a Red Green Blue (RGB) image, a multispectral image, and a hyperspectral image.

Moreover, according to an embodiment, the planar imaging sensor includes suitable optics for focusing received light on the photo detectors. The optics is configured to reflect the light received from a same spatial angle to at least one photo detector. Examples of the optics employed include, but are not limited to, a lens system and a mirror system.

According to an embodiment, the groups are configured to represent one spatial output pixel. The spatial output pixel is a function of the photo detectors of the planar imaging sensor. In particular, the spatial output pixel is a function of the groups of photo detectors.

Optionally, when a plurality of detection windows are employed in the planar imaging sensor, a detection window associated with each photo detector is reconfigured to all or some of the plurality of detection windows one-by-one. Such reconfiguration can be implemented in several ways, for example, such as a round-robin manner or a random manner. Moreover, such reconfiguration is implemented, while taking into account a proportionality of different groups of photo detectors.

In a case where the optics employed in the planar imaging sensor are arranged in a manner that each photo detector represents a unique angle in space from the planar imaging sensor, implementing such reconfiguration over a number of consecutive data sampling enables the planar imaging sensor to collect measurements from all possible distances. This is particularly relevant in practical implementations where a high sampling frequency, for example in a range of 1 khz to 10 khz, allows substantially simultaneous measurements to be collected for each photo detector in all or a sub-set of the plurality of detections windows.

Optionally, a processor is included in the same chip on which the planar imaging sensor is implemented. Optionally, the processor is configured to process data read out from the photo detectors of the planar imaging sensor to yield the spatial output pixel.

Alternatively, optionally, the data is read out from the photo detectors separately, and processed by an external processing device to yield the spatial output pixel.

Furthermore, embodiments of the present disclosure provide a pixel sensor comprising a plurality of planar imaging sensors. One such pixel sensor has been illustrated in conjunction with FIG. 4 as explained in more detail below.

Each of the planar imaging sensors represents one spatial output pixel. Thus, the number of planar imaging sensors in the pixel sensor corresponds to a number of pixels represented by the pixel sensor.

As an example, a 4×4 pixel sensor includes 16 planar imaging sensors that are arranged in a 4×4 array. As another example, an 8×8 pixel sensor includes 64 planar imaging sensors that are arranged in an 8×8 array. As yet another example, a 512×512 pixel sensor includes 262144 planar imaging sensors that are arranged in a 512×512 array. It is to be noted here that the pixel sensor is not limited to any specific dimension.

For illustration purposes only, there will now be considered an example planar imaging sensor pursuant to embodiments of the present disclosure. One such planar imaging sensor has been illustrated in conjunction with FIGS. 2A and 2B as explained in more detail below.

Figure 2A:
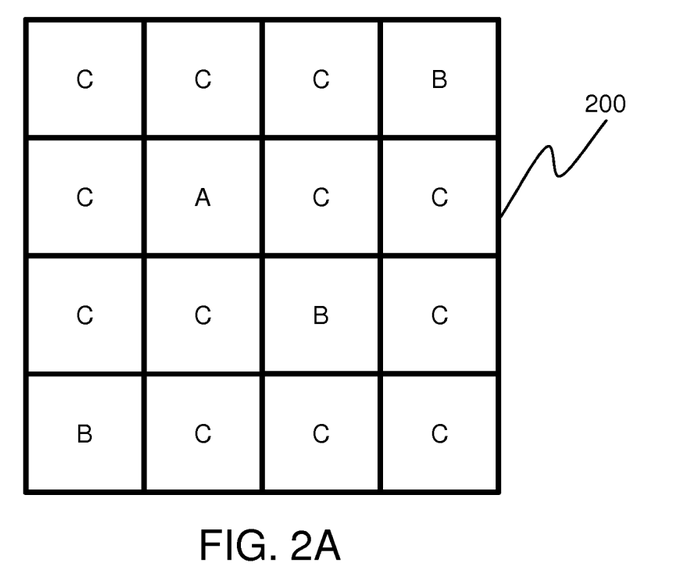
FIGS. 2A and 2B are schematic illustrations of example configurations of a planar imaging sensor, in accordance with an embodiment of the present disclosure.

In the illustrated example, the planar imaging sensor includes 16 photo detectors that are arranged in a 4×4 array, wherein the photo detectors are divided into a plurality of groups, namely three groups 'A', 'B' and 'C'. The number of photo detectors in the group 'C' is larger than the number of photo detectors in the group 'B', which is larger than the number of photo detectors in the group 'A'.

Each of the groups 'A', 'B' and 'C' has a specific detection window. The photo detectors of the group 'A' are configured to have a first detection window; the photo detectors of the group 'B' are configured to have a second detection window; and the photo detectors of the group 'C' are configured to have a third detection window.

Beneficially, the number of photo detectors in each group corresponds to a starting time of the specific detection window. Accordingly, the third detection window is configured to start later in time than the second detection window, which is configured to start later in time than the first detection window. In other words, the third detection window is configured to start later in time than the first and second detection windows, as the number of photo detectors in the group 'C' is larger than the number of photo detectors in the group 'A' or 'B'. This allows the photo detectors of the group 'C' to detect accurately light reflected from longer distances.

A first table below provides an example of the first, second and third detection windows. This table also provides example distances that are defined by the first, second and third detection windows.

| Group | Start Time | End Time | From Distance | To Distance |
|-------|------------|----------|---------------|-------------|
| A | 25 ns | 200 ns | 3.75 m | 30 m |
| B | 190 ns | 660 ns | 28.5 m | 99 m |
| C | 650 ns | 20000 ns | 97.5 m | 3000 m |

A column 'Group' denotes a group to which a given photo detector belongs. Columns 'Start Time' and 'End Time' denote a starting time and an ending time, respectively, of a detection window that the given photo detector is configured to have. Columns 'From Distance' and 'To Distance' denote a range of distance from which the given photo detector is configured to receive reflected light.

It will be appreciated that the range of distance is defined by the detection window, and can be calculated as follows:

$$d = \frac{1}{2} c \times t,$$

where
'd' represents a distance between the planar imaging sensor and a surface from which a light pulse reflected back to the planar imaging sensor,
'c' represents a speed of light, which is equal to $3 \times 10^8$ m/s in vacuum, and
't' represents a time taken by the light pulse to return to the planar imaging sensor.

For illustration purposes only, there will now be considered some example mathematical calculations as follows:
For t=25 ns, $$d = 3 \times 10^8 \times 25 \times 10^{-9}/2 = 3.75 \text{ m}$$

For t=200 ns, $$d = 3 \times 10^8 \times 200 \times 10^{-9}/2 = 30 \text{ m}$$

For t=190 ns, $$d = 3 \times 10^8 \times 190 \times 10^{-9}/2 = 28.5 \text{ m}$$

For t=660 ns, $$d = 3 \times 10^8 \times 660 \times 10^{-9}/2 = 99 \text{ m}$$

For t=650 ns, $$d = 3 \times 10^8 \times 650 \times 10^{-9}/2 = 97.5 \text{ m}$$

For t=20000 ns, $$d = 3 \times 10^8 \times 20000 \times 10^{-9}/2 = 3000 \text{ m}$$

In the above table, the first detection window has a starting time of 25 ns and an ending time of 200 ns. As a result, the photo detectors of the group 'A' are configured to receive reflected light from short distances, namely distances ranging between 3.75 m and 30 m.

Likewise, the second detection window has a starting time of 190 ns and an ending time of 660 ns. As a result, the photo detectors of the group 'B' are configured to receive reflected light from medium distances, namely distances ranging between 28.5 m and 99 m.

Likewise, the third detection window has a starting time of 650 ns and an ending time of 20000 ns. As a result, the photo detectors of the group 'C' are configured to receive reflected light from long distances, namely distances ranging between 97.5 m and 3000 m.

Moreover, the third detection window is configured to start substantially when the second detection window is configured to end, while the second detection window is configured to start substantially when the first detection window is configured to end.

It is to be noted here that adjacent detection windows are optionally configured to slightly overlap at boundaries, so as to avoid data collection errors occurring due to instrument errors in the photo detectors. With reference to the above table, there is a slight overlap of 10 ns at the boundaries of the first and second detection windows and of the second and third detection windows. In other words, the starting time of the second detection window is 10 ns before the ending time of the first detection window, while the starting time of the third detection window is 10 ns before the ending time of the second detection window.

Moreover, it is evident from the above table that the third detection window is longer than the second detection window, which is longer than the first detection window. From the above table, it can be seen that the photo detectors of the groups 'A' and 'B' are configured to receive reflected light from short and medium distances, respectively, while the photo detectors of the group 'C' are configured to receive reflect light from long distances. Thus, an example configuration as provided in the above table pertains to a case where the planar imaging sensor is configured to act as a long range sensor.

Moreover, optionally, the photo detectors of a given group are arranged substantially symmetrically in the 4×4 array. Optionally, the photo detectors of the groups 'A' and 'B' are arranged in a proximity of a centre of the planar imaging sensor, while the photo detectors of the group 'C' are arranged in a proximity of a perimeter of the planar imaging sensor. This potentially enables the optics employed in the planar imaging sensor to focus light pulses in an appropriate manner.

Optionally, a detection window associated with a photo detector is reconfigurable. Thus, the planar imaging sensor can be reconfigured to act as a short range sensor or a medium range sensor.

Figure 2B:
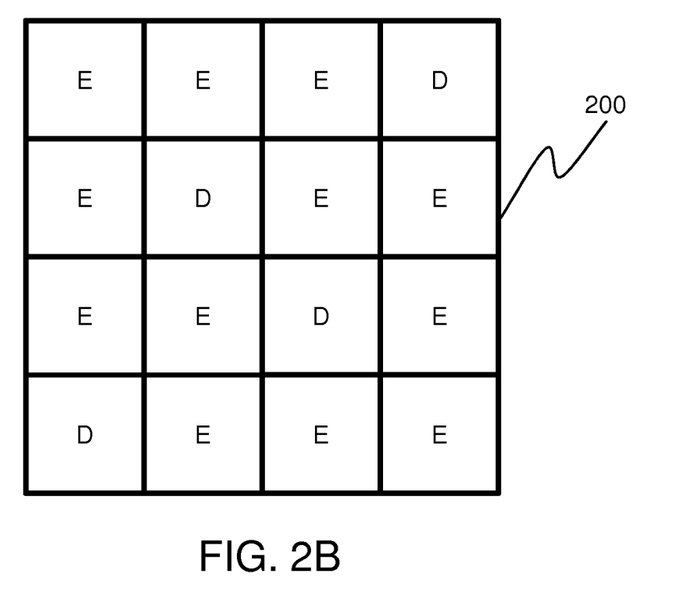

Optionally, in this regard, the photo detectors of the planar imaging sensor are regrouped. For illustration purposes only, there will now be considered another example configuration of the photo detectors, wherein the photo detectors of the planar imaging sensor are regrouped into two groups, namely groups 'D' and 'E'. The number of photo detectors in the group 'E' is larger than the number of photo detectors in the group 'D'. As described earlier, each of the groups 'D' and 'E' is configured to a specific detection window.

A second table below provides an example of detection windows employed, when the planar imaging sensor is reconfigured to act as a short range sensor.

| Group | Start Time | End Time | From Distance | To Distance |
|-------|------------|----------|---------------|-------------|
| D | 1 ns | 30 ns | 0.15 m | 4.5 m |
| E | 25 ns | 1000 ns | 3.75 m | 150 m |

In this manner, the planar imaging sensor can be configured to act as a short range sensor, a medium range sensor or a long range sensor, as desired.

For illustration purposes only, there will now be considered another example planar imaging sensor pursuant to embodiments of the present disclosure. One such planar imaging sensor has been illustrated in conjunction with FIG. 3 as explained in more detail below.

Figure 3:
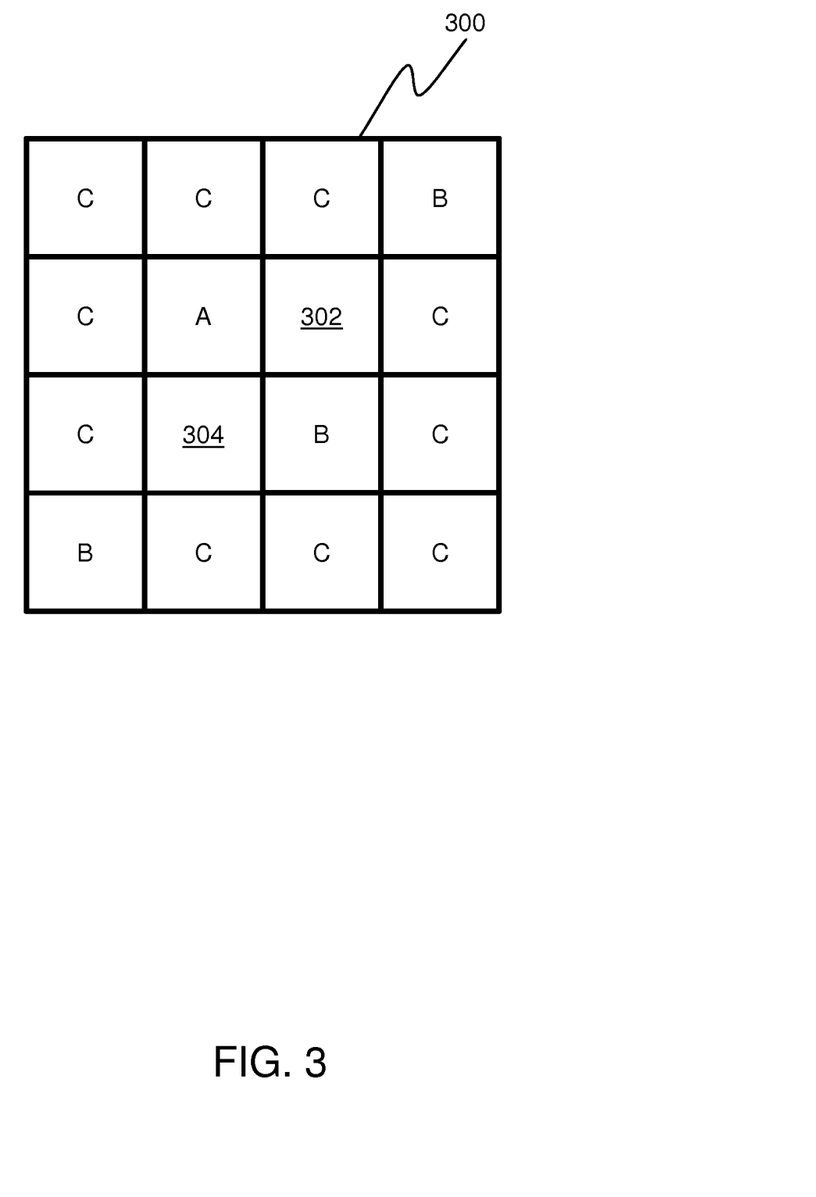
FIG. 3 is a schematic illustration of another planar imaging sensor, in accordance with an embodiment of the present disclosure.

In the illustrated example, the planar imaging sensor includes a plurality of photo detectors, wherein the photo detectors are divided into a plurality of groups, namely three groups 'A', 'B' and 'C'. The planar imaging sensor further includes at least one photo sensor configured to measure an intensity of light, and at least one light emitting component.

The number of photo detectors in the group 'C' is larger than the number of photo detectors in the group 'B', which is larger than the number of photo detectors in the group 'A'.

The photo detectors of the groups 'A', 'B' and 'C' are configured to have a first detection window, a second detection window and a third detection window, respectively. The third detection window is configured to start later in time than the second detection window, which is configured to start later in time than the first detection window.

Moreover, the third detection window is configured to start substantially when the second detection window is configured to end, while the second detection window is configured to start substantially when the first detection window is configured to end.

Moreover, the third detection window is longer than the second detection window, which is longer than the first detection window. In this manner, the photo detectors of the groups 'A' and 'B' are configured to receive reflected light from short and medium distances, respectively, while the photo detectors of the group 'C' are configured to receive reflect light from long distances.

Furthermore, optionally, a detection window associated with a photo detector is reconfigurable. Therefore, the planar imaging sensor can be configured to act as a short range sensor, a medium range sensor or a long range sensor, as desired.

In a second aspect, embodiments of the present disclosure provide a sensor system comprising:
  a planar imaging sensor; and
  a processor communicably coupled to a light source and the planar imaging sensor, the processor being configured to process data collected by the planar imaging sensor from multiple spatial positions.

In an embodiment, the light source is external to the sensor system. In another embodiment, the light source is integrated on a same chip on which the planar imaging sensor is implemented.

As described earlier, the planar imaging sensor includes a plurality of photo detectors that are divided into a plurality of groups, each group having a specific detection window. In this regard, optionally, the processor is configured to set the specific detection window for that group. In other words, the processor is configured to set a specific detection window for each photo detector, whereby photo detectors with a same detection window effectively form a group.

According to an embodiment, the processor is configured to reset detection windows of the groups of photo detectors, as and when required.

Moreover, coupling the processor to the light source enables the processor to synchronize detection windows of the photo detectors in different groups according to a time when a given light pulse is emitted. This allows the photo detectors to collect data from different spatial positions that are located at different distances from the sensor system, for example, as explained in more detail later.

According to an embodiment, the sensor system further comprises:
  a data memory associated with the processor,
  a gating circuitry for gating the photo detectors to their respective detection windows,
  a readout circuitry for reading out the data from the planar imaging sensor and transferring the data to the processor, and
  a power source for supplying electrical power to various components of the sensor system.

According to an embodiment, the sensor system further comprises a timing circuitry for recording a time of triggering of each photo detector. The timing circuitry measures a time taken by an emitted light pulse to return to a given photo detector, namely a time of flight of the light pulse. The time of flight of the light pulse is indicative of a distance of a surface from which the light pulse reflected back to the sensor system. This is particularly beneficial in a case where an exact distance to the surface is required to be recorded.

Optionally, the sensor system includes optics that are attached to the photo detectors of the planar imaging sensor. Examples of the optics include, but are not limited to, a lens system and a mirror system.

Optionally, the optics attached to the light source and the optics attached to the photo detectors are arranged to form a coaxial configuration.

For illustration purposes only, there will now be considered an example environment, wherein a sensor system is implemented pursuant to embodiments of the present disclosure. One such example environment has been illustrated in conjunction with FIG. 1 as explained in more detail below.

Figure 1:
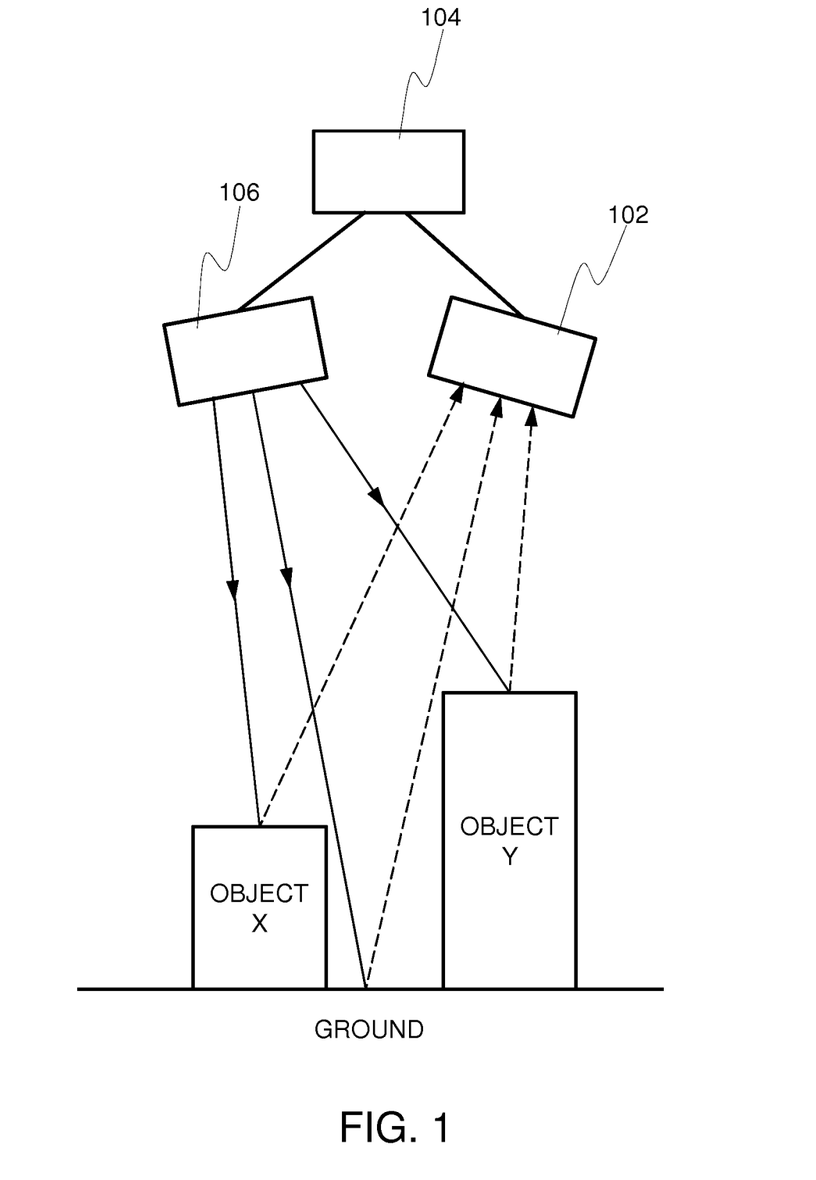
FIG. 1 is a schematic illustration of an example environment, wherein a sensor system is implemented pursuant to an embodiment of the present disclosure.

In the example environment, different objects are positioned above the ground surface of the Earth, wherein the different objects have different heights. Examples of objects include, but are not limited to, buildings, bridges, and vehicles. Moreover, the ground surface can also have varying altitude.

In the example herein, the sensor system includes a planar imaging sensor and a processor communicably coupled to a light source and the planar imaging sensor. Optionally, the light source is external to the sensor system. Alternatively, optionally, the light source is integrated on a same chip on which the planar imaging sensor is implemented.

In the example environment, let us consider that the sensor system is implemented to scan the objects and the ground surface from above. For this purpose, optionally, the sensor system can be implemented on an airborne device that is configured to fly along an aerial route.

The light source is configured to emit light pulses, while photo detectors included in the planar imaging sensor are configured to detect reflections of the light pulses from the objects and the ground surface.

For each light pulse emitted by the light source, the processor is configured to synchronize detection windows of the photo detectors according to a time when that light pulse is emitted. This allows the photo detectors to collect data from different spatial positions that are located at different distances from the sensor system.

Optionally, in this regard, the processor is configured to measure a time that each light pulse takes to return to the sensor system, and determine, from the measured time, a distance between the sensor system and a surface from which that light pulse reflected back to the sensor system. Knowledge of the distance between the sensor system and the surface, an absolute spatial position of the sensor system and an orientation of the sensor system enables the processor to determine a spatial position of the surface.

In an example case where the sensor system is implemented on an airborne device, a Global Positioning System (GPS) unit of the airborne device is employed to determine absolute spatial positions of the airborne device upon a surface of the Earth when collecting the data. Additionally, optionally, an Inertial Measurement Unit (IMU) of the airborne device is employed to determine orientations of the airborne device when collecting the data. The absolute spatial positions and the orientations of the airborne device beneficially correspond to absolute spatial positions and orientations of the sensor system.

Optionally, the data collected from the different spatial positions is post-processed to generate a range image of the objects and the ground surface, namely an image indicative of a range of distances from the sensor system. Optionally, such post-processing is performed at a data processing arrangement that is remote to the sensor system.

Furthermore, the sensor system can be employed for various purposes. As an example, the sensor system can be employed for navigation of a natural or man-made environment, where there is a need to sense distances to the natural or man-made environment, for example, to avoid collision or to reprogram a route of a vehicle. In this regard, the sensor system can be employed in:
- self-driving vehicles,
- environment sensing systems for visually impaired people, and
- sense and avoid systems for unmanned aerial vehicles.

In a third aspect, embodiments of the present disclosure provide a method for recording and processing of an image, comprising:
- emitting light;
- detecting reflected light for a first period of time starting at time t1 and using a first group of photo detectors; and
- detecting reflected light for a second period of time starting at time t2 and using a second, larger group of photo detectors, wherein t2 is later than t1.

According to an embodiment, the second period of time is longer than the first period of time.

DETAILED DESCRIPTION OF DRAWINGS

Referring now to the drawings, particularly by their reference numbers, FIG. 1 is a schematic illustration of an example environment, wherein a sensor system 100 is implemented pursuant to an embodiment of the present disclosure. The sensor system 100 includes a planar imaging sensor 102 and a processor 104 communicably coupled to a light source 106 and the planar imaging sensor 102.

In the example environment, objects 'X' and 'Y' are positioned above the ground surface of the Earth, and a height of the object 'Y' above the ground surface is greater than a height of the object 'X' above the ground surface.

With reference to FIG. 1, the sensor system 100 is implemented to scan the ground surface and the objects 'X' and 'Y' from above.

The light source 106 is configured to emit light pulses, while photo detectors included in the planar imaging sensor 102 are configured to detect reflections of the light pulses from the ground surface and the objects 'X' and 'Y'.

The object 'Y' is closer to the sensor system 100 than the object 'X', which is closer to the sensor system 100 than the ground surface. As a result, a light pulse that reflects back from the object 'Y' returns to the sensor system 100 before a light pulse that reflects back from the object 'X' or the ground surface. Thus, for each light pulse emitted by the light source 106, the processor 104 is configured to synchronize detection windows of the photo detectors according to a time when that light pulse is emitted. This allows the photo detectors to collect data from different spatial positions that are located at different distances from the sensor system 100.

FIG. 1 is merely an example, which should not unduly limit the scope of the present disclosure. A person skilled in the art will recognize many variations, alternatives, and modifications of embodiments of the present disclosure.

FIGS. 2A and 2B are schematic illustrations of example configurations of a planar imaging sensor 200, in accordance with an embodiment of the present disclosure. The planar imaging sensor 200 includes a plurality of photo detectors, depicted as 16 photo detectors that are arranged in a 4×4 array.

With reference to a first example configuration, the photo detectors are divided into three groups, depicted as groups 'A', 'B' and 'C' in FIG. 2A.

With reference to a second example configuration, the photo detectors are divided into two groups, depicted as groups 'D' and 'E' in FIG. 2B.

In an example, the first example configuration corresponds to a case where the planar imaging sensor 200 is configured to act as a long range sensor, while the second example configuration corresponds to a case where the planar imaging sensor 200 is configured to act as a short range sensor.

FIGS. 2A and 2B are merely examples, which should not unduly limit the scope of the present disclosure. It is to be understood that the illustration of the planar imaging sensor 200 is provided as an example and is not limited to a specific number, type and/or arrangement of photo detectors. A person skilled in the art will recognize many variations, alternatives, and modifications of embodiments of the present disclosure.

FIG. 3 is a schematic illustration of another example planar imaging sensor 300, in accordance with an embodiment of the present disclosure. The planar imaging sensor 300 includes a plurality of photo detectors, wherein the photo detectors are divided into a plurality of groups, depicted as three groups 'A', 'B' and 'C' in FIG. 3.

The planar imaging sensor 300 further includes at least one photo sensor configured to measure an intensity of light, depicted as a photo sensor 302 in FIG. 3.

The planar imaging sensor 300 also includes at least one light emitting component, depicted as a light emitting component 304 in FIG. 3.

With reference to FIG. 3, the photo detectors, the photo sensor 302 and the light emitting component 304 are arranged in a 4×4 array.

Moreover, each of the groups 'A', 'B' and 'C' has a specific detection window. As the photo detectors of different groups are configured to different detection windows, the photo detectors of these groups are capable of detecting light reflected from different distances.

FIG. 3 is merely an example, which should not unduly limit the scope of the present disclosure. It is to be understood that the illustration of the planar imaging sensor 300 is provided as an example and is not limited to a specific number, type and/or arrangement of photo detectors, photo sensors and light emitting components. A person skilled in the art will recognize many variations, alternatives, and modifications of embodiments of the present disclosure.

Figure 4:
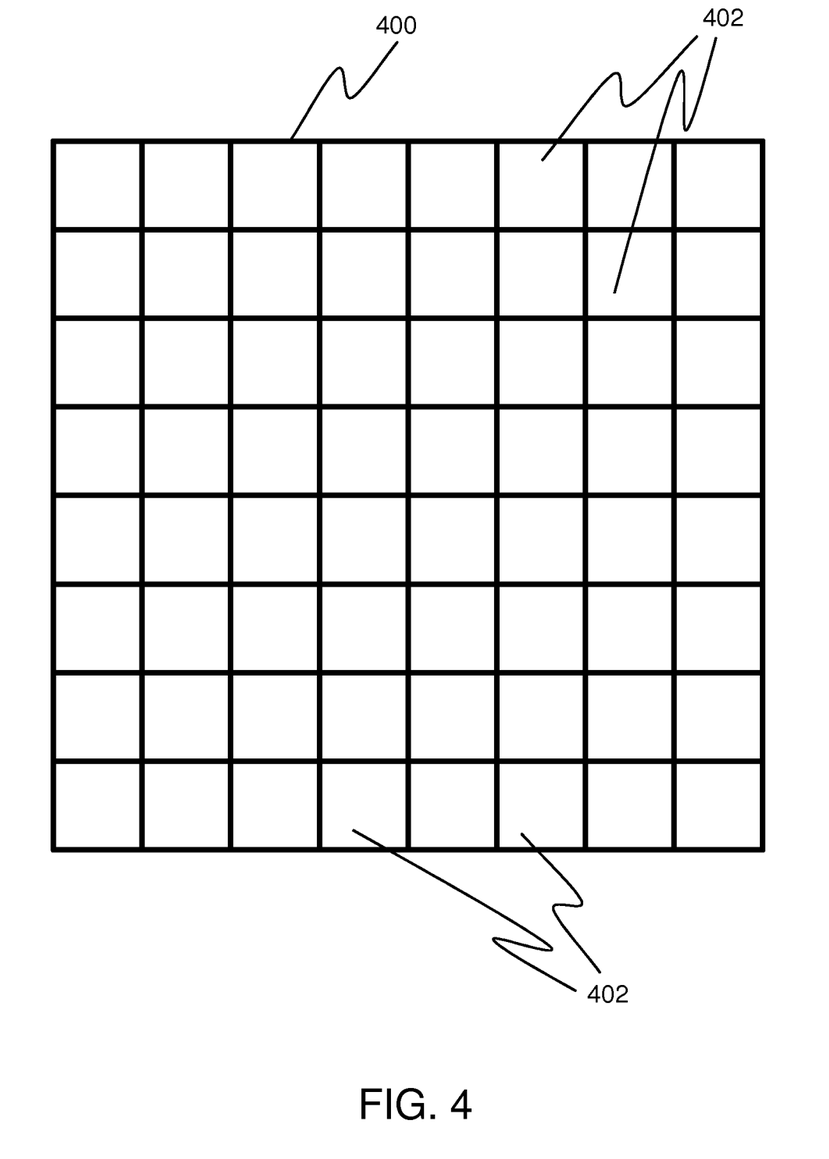
FIG. 4 is a schematic illustration of a pixel sensor, in accordance with an embodiment of the present disclosure.

FIG. 4 is a schematic illustration of a pixel sensor 400, in accordance with an embodiment of the present disclosure. The pixel sensor 400 includes a plurality of planar imaging sensors, depicted as 64 planar imaging sensors 402 in FIG. 4.

With reference to FIG. 4, the planar imaging sensors 402 are arranged in an 8×8 array, thereby forming an 8×8 pixel sensor.

Each of the planar imaging sensors 402 represents one spatial output pixel. Thus, the pixel sensor 400 represents 64 pixels.

FIG. 4 is merely an example, which should not unduly limit the scope of the present disclosure. It is to be understood that the illustration of the pixel sensor 400 is provided as an example and is not limited to a specific number and/or arrangement of planar imaging sensors. A person skilled in the art will recognize many variations, alternatives, and modifications of embodiments of the present disclosure.

Figure 5:
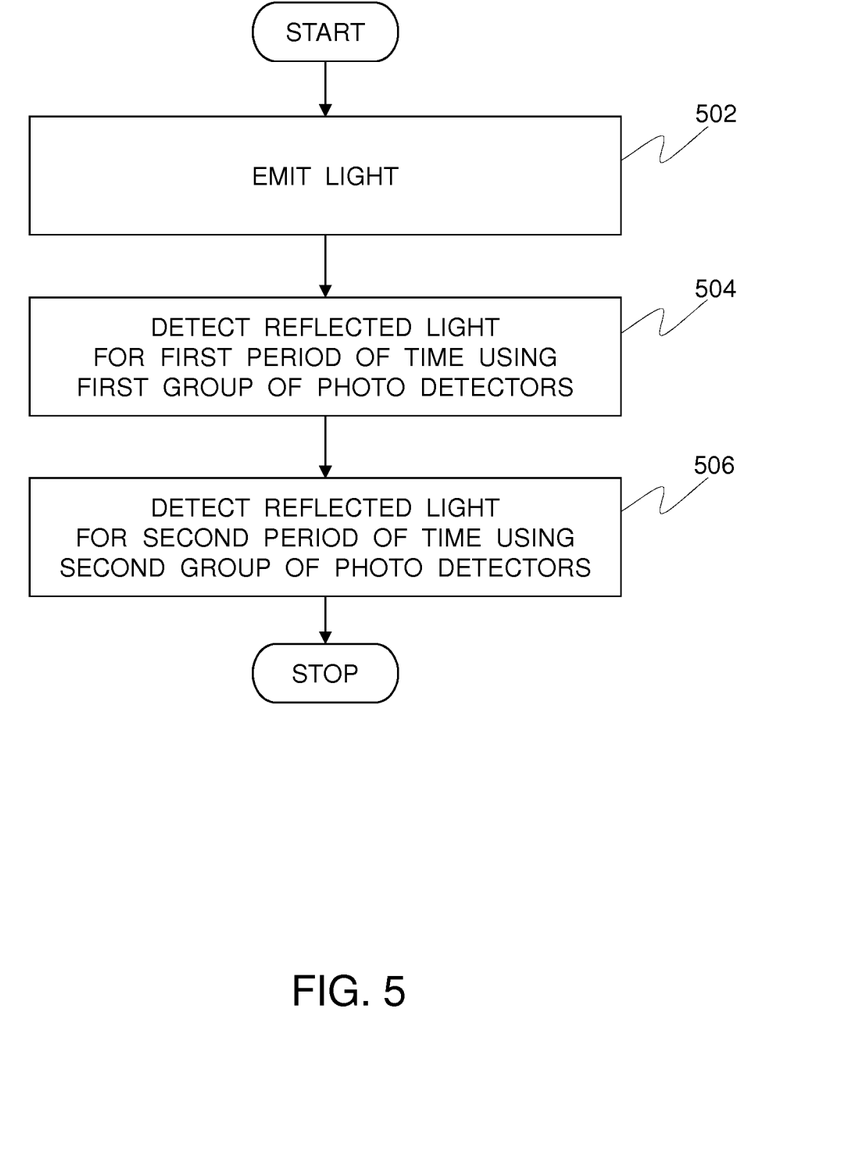
FIG. 5 is an illustration of steps of a method for recording and processing of an image, in accordance with an embodiment of the present disclosure.

FIG. 5 is an illustration of steps of a method for recording and processing of an image, in accordance with an embodiment of the present disclosure. The method is depicted as a collection of steps in a logical flow diagram, which represents a sequence of steps that can be implemented in hardware, software, or a combination thereof.

At a step 502, light is emitted.

At a step 504, reflected light is detected for a first period of time starting at time t1 and using a first group of photo detectors.

At a step 506, reflected light is detected for a second period of time starting at time t2 and using a second, larger group of photo detectors are detected. In accordance with the step 506, t2 is later than t1.

The steps 502 to 506 are only illustrative and other alternatives can also be provided where one or more steps are added, one or more steps are removed, or one or more steps are provided in a different sequence without departing from the scope of the claims herein.

Embodiments of the present disclosure are susceptible to being used for various purposes, including, though not limited to, enabling detection of light reflected from different distances using a same sensor system.

Modifications to embodiments of the present disclosure described in the foregoing are possible without departing from the scope of the present disclosure as defined by the accompanying claims. Expressions such as "including", "comprising", "incorporating", "consisting of", "have", "is" used to describe and claim the present disclosure are intended to be construed in a non-exclusive manner, namely allowing for items, components or elements not explicitly described also to be present. Reference to the singular is also to be construed to relate to the plural.

What is claimed is:

1. A planar imaging sensor comprising a plurality of photo detectors, wherein
    the plurality of photo detectors are divided into at least a first group and a second group,
    the photo detectors of the first group are configured to have a first detection window,
    the photo detectors of the second group are configured to have a second detection window, which second detection window is configured to start later in time than the first detection window, and
    the number of photo detectors in the second group is larger than the number of photo detectors in the first group.

2. The planar imaging sensor according to claim 1, wherein the second detection window is longer than the first detection window.

3. The planar imaging sensor according to claim 1, wherein a detection window associated with a photo detector is reconfigurable.

4. The planar imaging sensor according to claim 1, wherein the second detection window is configured to start substantially when the first detection window is configured to end.

5. The planar imaging sensor according to claim 1, wherein the plurality of photo detectors are divided into a plurality of groups, each group having a specific detection window, the number of photo detectors in each group corresponding to a starting time of the specific detection window.

6. The planar imaging sensor according to claim 1, wherein the grouping of the photo detectors is reconfigurable.

7. The planar imaging sensor according to claim 1, wherein the plurality of photo detectors are single photon avalanche diodes.

8. The planar imaging sensor according to claim 1, further comprising at least one light emitting component.

9. The planar imaging sensor according to claim 1, further comprising at least one photo sensor configured to measure an intensity of light.

10. The planar imaging sensor according to claim 1, wherein the planar imaging sensor is implemented in one chip.

11. The planar imaging sensor according to claim 1, wherein the groups are configured to represent one spatial output pixel.

12. A sensor system comprising:
    a planar imaging sensor according to claim 1; and
    a processor communicably coupled to a light source and the planar imaging sensor, the processor being configured to process data collected by the planar imaging sensor from multiple spatial positions.

13. A method for recording and processing of an image, comprising:
    emitting light;
    detecting reflected light for a first period of time starting at time t1 and using a first group of photo detectors; and
    detecting reflected light for a second period of time starting at time t2 and using a second, larger group of photo detectors,
wherein t2 is later than t1.

14. The method according to claim 13, wherein the second period of time is longer than the first period of time.

\* \* \* \* \*